US011646751B2

(12) United States Patent
Geiger et al.

(10) Patent No.: US 11,646,751 B2
(45) Date of Patent: May 9, 2023

(54) APPARATUSES, SYSTEMS, AND METHODS FOR IDENTIFYING MULTI-BIT ERRORS

(71) Applicant: Micron Technology, Inc., Boise, ID (US)

(72) Inventors: Markus H. Geiger, Boise, ID (US);
Matthew A. Prather, Boise, ID (US);
Sujeet Ayyapureddi, Boise, ID (US);
C. Omar Benitez, Boise, ID (US);
Dennis Montierth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/348,654

(22) Filed: Jun. 15, 2021

(65) Prior Publication Data
US 2022/0399902 A1    Dec. 15, 2022

(51) Int. Cl.
*H03M 13/09* (2006.01)
*G06F 11/10* (2006.01)

(52) U.S. Cl.
CPC ....... *H03M 13/095* (2013.01); *G06F 11/1076* (2013.01)

(58) Field of Classification Search
CPC .................. H03M 13/095; G06F 11/1076
See application file for complete search history.

(56) References Cited

U.S. PATENT DOCUMENTS

| | | | | |
|---|---|---|---|---|
| 10,725,841 | B1* | 7/2020 | Rahul | H03M 13/618 |
| 2006/0224789 | A1* | 10/2006 | Cho | G11C 7/1039 |
| | | | | 710/52 |
| 2014/0146624 | A1* | 5/2014 | Son | G06F 11/1048 |
| | | | | 365/200 |
| 2014/0245096 | A1* | 8/2014 | Motwani | H03M 13/13 |
| | | | | 714/755 |
| 2014/0337691 | A1* | 11/2014 | Miller | G06F 15/16 |
| | | | | 714/776 |
| 2016/0036463 | A1* | 2/2016 | Heisswolf | H03M 13/13 |
| | | | | 714/764 |
| 2016/0350180 | A1* | 12/2016 | Halbert | G06F 11/1048 |
| 2017/0308433 | A1* | 10/2017 | Kwon | G11C 29/52 |

\* cited by examiner

*Primary Examiner* — Thien Nguyen
(74) *Attorney, Agent, or Firm* — Dorsey & Whitney LLP

(57) ABSTRACT

Apparatuses, systems, and methods for multi-bit error detection. A memory device may store data bits and parity bits in a memory array. An error correction code (ECC) circuit may generate syndrome bits based on the data and parity bits and use the syndrome bits to correct up to a single bit error in the data and parity bits. A multi-bit error (MBE) detection circuit may detect an MBE in the data and parity based on at least one of the syndrome bits or the parity bits. For example, the MBE detection circuit may determine if the syndrome bits have a mapped or unmapped state and/or may compare the parity bits, data bits, and an additional parity bit to determine if there is an MBE. When an MBE is detected an MBE signal is activated. In some embodiments, an MBE flag may be set based on the MBE signal being active.

26 Claims, 7 Drawing Sheets

APPARATUSES, SYSTEMS, AND METHODS FOR IDENTIFYING MULTI-BIT ERRORS

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors. However, some error correction circuits may not be able to resolve errors in more than one bit of information.

DETAILED DESCRIPTION

Figure 1:
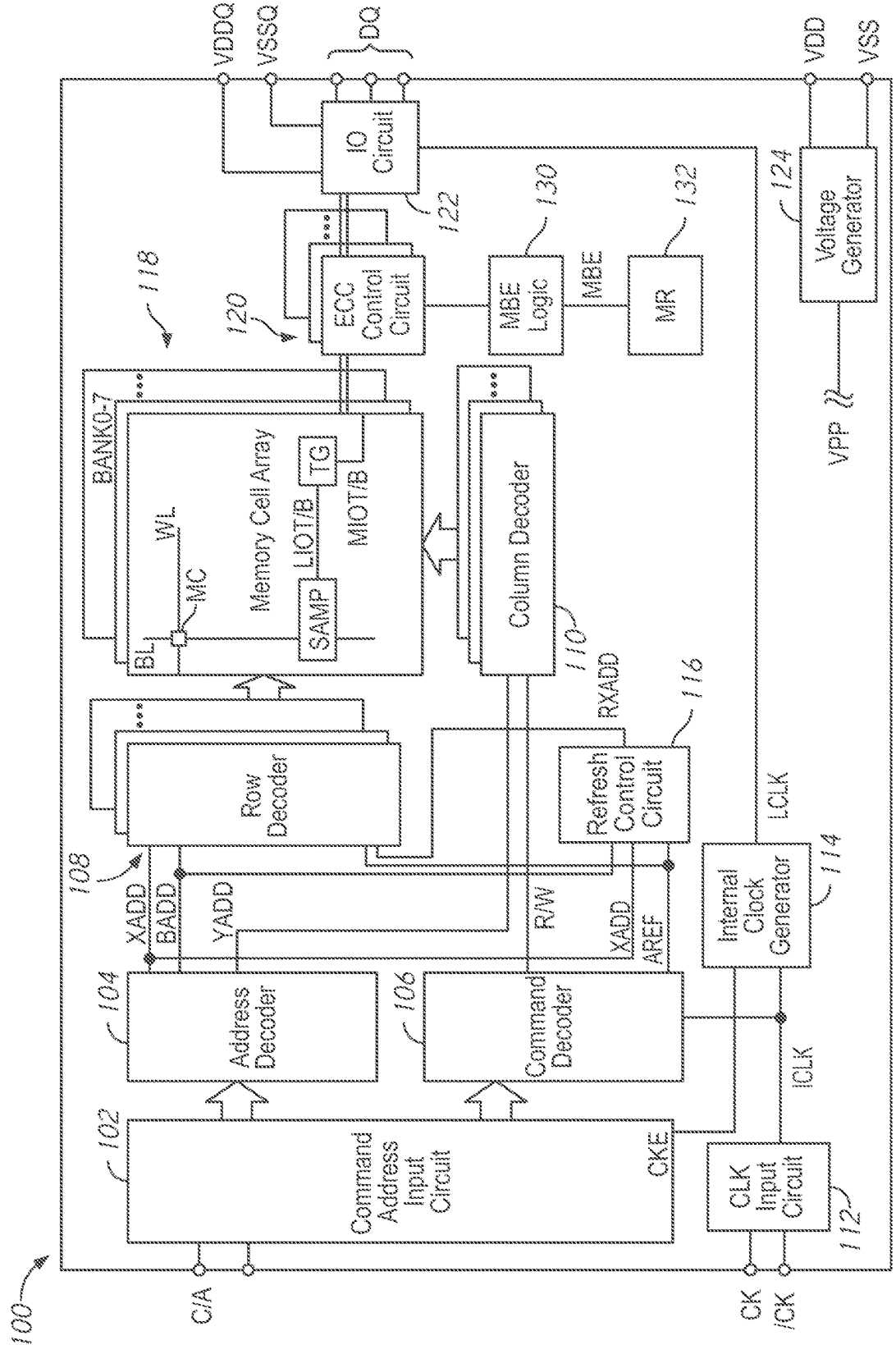
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. For example, a row may include M data bits and K parity bits, which may be used to correct up to one of the M data bits or one of the K parity bits. During a write operation the parity bits may be generated by an error correction code circuit based on the data written to the memory cells of the row. During a read operation the error correction code circuit may use the parity bits to determine if the read data bits are correct, and may correct any errors which are found.

An error correction code (ECC) circuit may be used to generate the parity bits based on written data during a write operation and compare the read data and read parity bits to locate errors. As part of the read operation, the ECC circuit may generate new parity bits based on the read data in a manner similar to generating the parity bits. The ECC circuit may then compare the new parity bits to the read parity bits in order to generate syndrome bits, which in turn may be used to locate errors. A logic tree (e.g., a tree of XOR gates) may be used to generate parity bits. For example, the logic tree may receive M data bits, and generate K parity bits. The state of the K parity bits may indicate the location of an error. However, some ECC circuits, which may be single error correction (SEC) circuits, may only be capable of correcting a single bit error. If multiple bits are in error, the ECC may not be able to correct the problem. There may be a need for the memory to identify if multiple bits are in error, for example to notify a controller operating the memory of the multi-bit error.

The present disclosure is directed to apparatuses, systems, and methods for identifying multi-bit errors. A memory array may store a set of data bits and a set of parity bits associated with those data bits. During a read operation, an ECC circuit may generate a set of syndrome bits based on the set of data bits. The memory may include a multi-bit error (MBE) detection circuit which may determine if an MBE is present in the set of data bits based, in part, on the set of syndrome bits. If an MBE is detected, the MBE detection circuit may provide an MBE signal at an active level. In some embodiments, responsive to the MBE signal, a flag may be set in the mode register of the memory. In some embodiments, the MBE signal may cause an address associated with the plurality of data bits to be captured (e.g., and saved in the mode register) to identify which memory cells include the MBE. In some embodiments, the memory may provide a 'real-time' alert, for example by sending a signal on an alert pin.

The MBE detection circuit may use various schemes to detect the MBE, alone or in various combinations. For example, in some embodiments, the memory may use a single error correction, single error detection (SEC-SED) scheme. The syndrome bits may have a plurality of states. A portion of the states may be mapped to single bit errors, and an additional state may be mapped to no detected error. If the syndrome bits have a state which is unmapped, it may indicate a MBE. In some examples, the memory may use a single error correction double error detection (SEC-DED) scheme. The memory may include an additional parity bit along with the set of data bits and the set of parity bits. In the case of an MBE in a SEC-DED scheme, the parity bits may change twice (e.g., be returned to an original state), however the use of the additional parity may help determine if a MBE is present, as explained in more detail herein.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the ECC control circuit 120. The ECC control circuit 120 may use the parity bits to determine if the read data includes any errors, and if any errors are detected, may correct them to generate corrected read data (e.g., by changing a state of the identified bit(s) which are in error). The corrected read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided to the memory array 118 to be written into the memory cells MC.

The ECC control circuit 120 may be used to ensure the fidelity of the data read from a particular group of memory cells to the data written to that group of memory cells. The device 100 may include a number of different ECC control circuits 120, each of which is responsible for a different portion of the memory cells MC of the memory array 118. For example, there may be one or more ECC control circuits 120 for each bank of the memory array 118.

Each ECC control circuit 120 may receive a certain number of data bits (either from the JO circuit 122 or the memory array 118) and may use a number of parity bits based on the number of data bits to correct potential errors in the data bits. For example, as part of a write operation an ECC control circuit 120 may receive 128 bits of data from the JO circuit 122 and may generate 8 parity bits based on those 128 data bits. The 128 data bits and the 8 parity bits (e.g., 136 total bits) may be written to the memory array 118. As part of an example read operation, the ECC control circuit 120 may receive 128 data bits and 8 parity bits from the memory cell array 118. The ECC control circuit 120 may generate new parity bits from the 128 data bits, and then compare the new parity bits to the read parity bits to generate syndrome bits. The syndrome bits may be used to locate errors and the ECC control circuit 120 and may correct them if any are found. While various embodiments may be discussed with reference to ECC circuits which use 8 parity bits to find one error in 128 data bits, it should be understood that these are for explanatory purposes only, and that other numbers of data bits, error bits, and parity bits may be used in other example embodiments. An example ECC circuit is discussed in more detail in FIG. 6.

The ECC control circuit 120 may be capable of correcting only a single bit error in the read data. For example, if one of the 128 data bits is in error, the ECC control circuit 120 may be able to correct it. If there is a multi-bit error (MBE), that is, if two or more bits are in error, then it may not be possible for the ECC control circuit 120 to correct it.

The device 100 may include MBE detection logic 130, which may determine if there is an MBE in the read data. If an MBE is detected, the MBE logic 130 may provide an MBE signal at an active level. Various actions may be taken responsive to the MBE signal at the active level. For example, responsive to the MBE signal being active, an MBE flag in a mode register 132 may be set. In some embodiments, responsive to the MBE signal being active, an address associated with the read data (e.g., XADD, YADD, and/or BADD) may be captured (e.g., saved in the mode register 132 alongside the MBE flag). In some embodiments, the MBE detection logic 130 may manage a count of the number of times the MBE signal has been activated. In some embodiments, the MBE signal at the active level may cause the memory device 100 to activate an alert signal (e.g., such as providing an active signal to an ALERT pin). In some embodiments, responsive to the MBE signal at the active level, the ECC circuit 120 may not correct the state of any bits in the read data (as too many bits are in error to be corrected). In some embodiments, the errors detected by the MBE logic 130 may be non-persistent. In other words, it is not necessary for the same memory cells to produce the same MBE every time they are accessed in order for the MBE detection logic 130 to detect the error. Each detected MBE may be detected independently of other detected MBEs.

Figure 3:
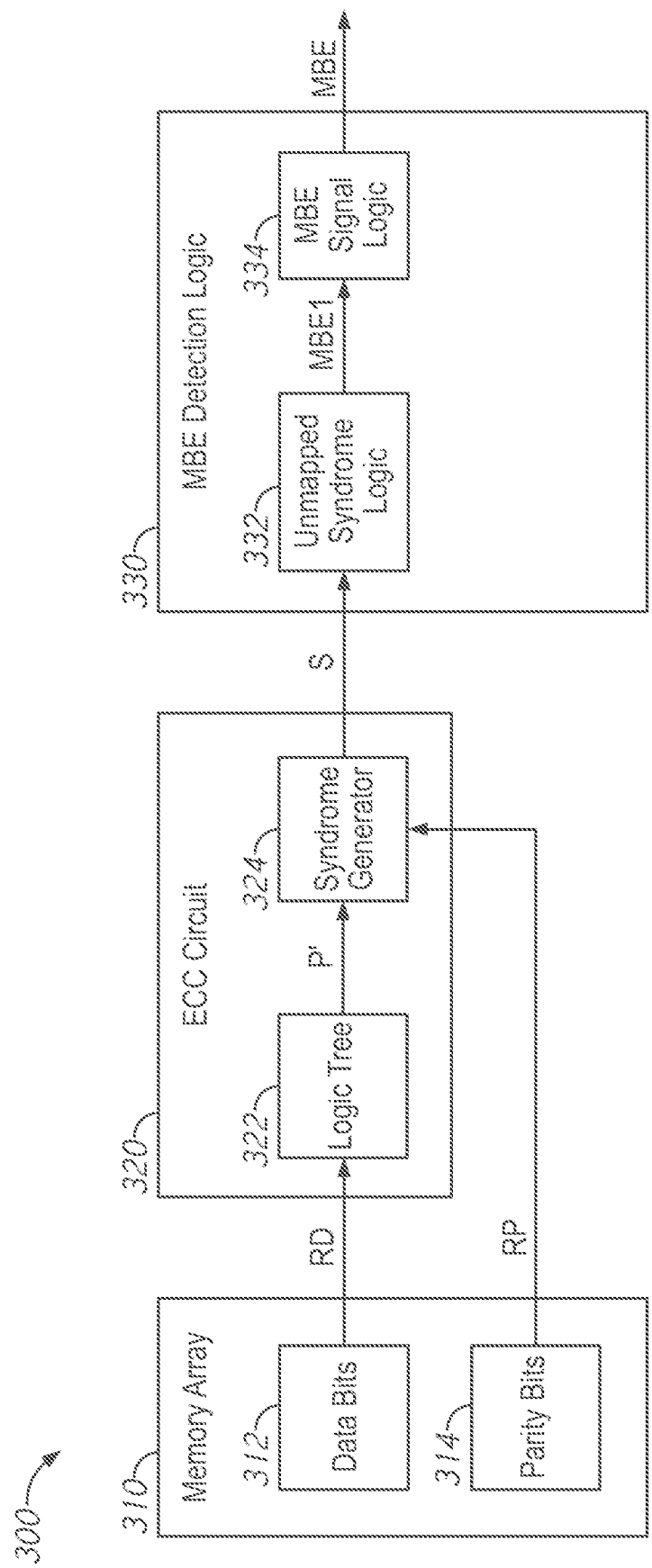
FIG. 3 is a block diagram of multi-bit error logic according to some embodiments of the present disclosure.

The MBE detection logic 130 may use various schemes, alone or together to determine if an MBE is present or not. For example, in some embodiments the MBE detection logic may include unmapped syndrome logic which may determine if the syndrome bits generated by the ECC control circuit 120 have an unmapped state. The syndrome may have a number of states, some of which are mapped to single bit locations in the plurality of data bits and parity bits (e.g., 128 states for the data bits and 8 states for the parity bits). However, the syndrome may also have additional states which are unmapped. The mapped states are those the ECC circuit 120 is capable of interpreting as single bit error locations (or no errors) and correcting (if needed). The unmapped states represent errors (such as MBEs) which are uncorrectable by the ECC circuit 120. If the unmapped syndrome logic detects one of these unmapped states, it may indicate a MBE, and the MBE logic 130 may provide the MBE signal at an active level. FIG. 3 describes an embodiment with unmapped syndrome logic in more detail.

Figure 4:
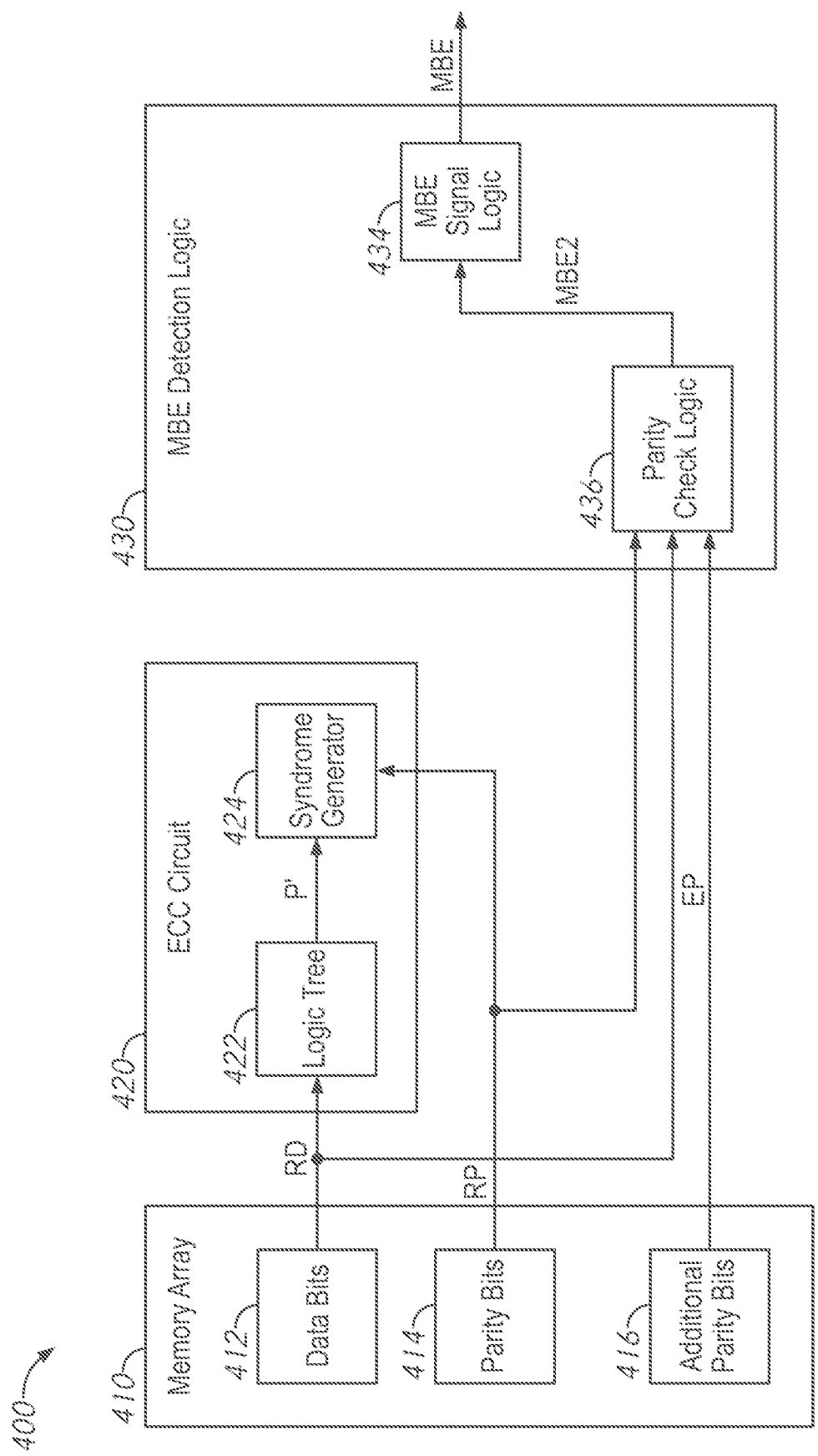
FIG. 4 is a block diagram of multi-bit error logic according to some embodiments of the present disclosure.

In some embodiments, the MBE detection logic 130 may include parity check logic, which may use the read data, the read parity bits, and an additional parity bit read from the memory array 118 to determine if there is an MBE. For example, rather than 8 parity bits, a total of 9 parity bits may be read from the memory array 118 (e.g., the 8 parity bits previously described and an additional parity bit). FIG. 4 describes an embodiment with parity check logic in more detail.

Figure 5:
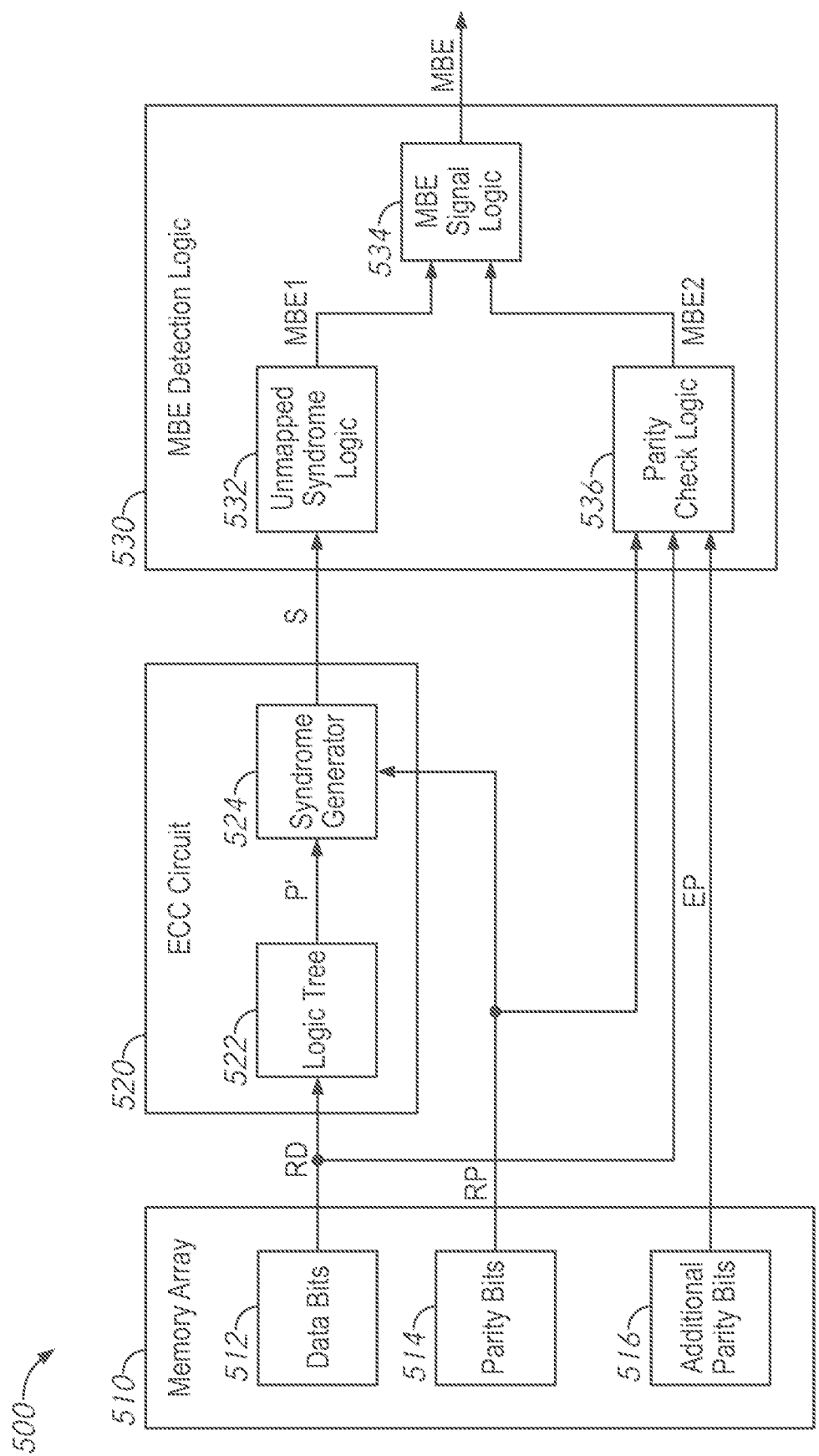
FIG. 5 is a block diagram of multi-bit error logic according to some embodiments of the present disclosure.

In some embodiments, multiple schemes for MBE detection may be used together. For example, the unmapped syndrome logic and parity check logic may be combined and either logic may be used to indicate an MBE. FIG. 5 describes an embodiment with a combination of MBE detection schemes in more detail.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
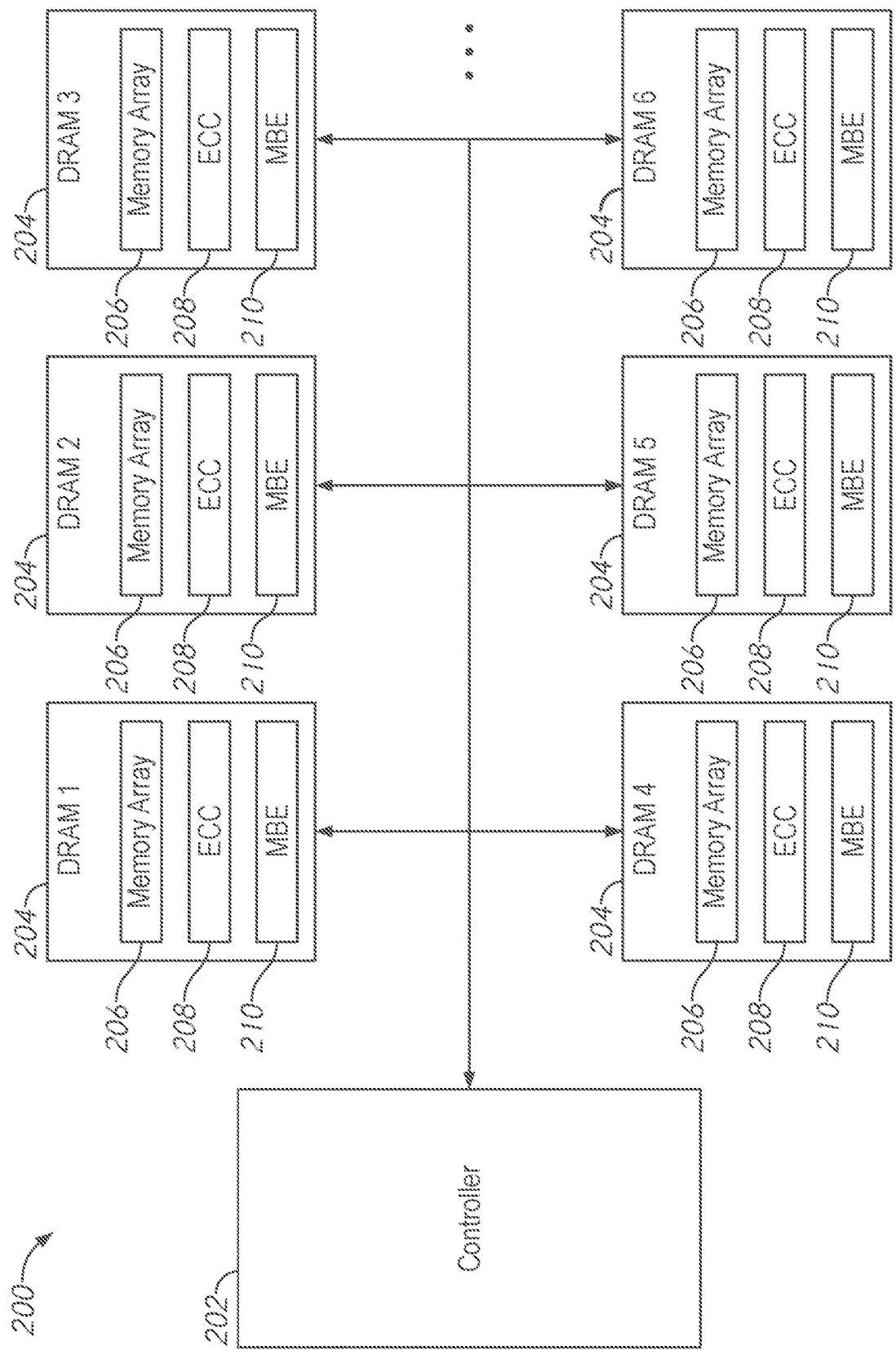
FIG. 2 is a block diagram of a memory system according to some embodiments of the present disclosure.

FIG. 2 is a block diagram of a memory system according to some embodiments of the present disclosure. The system 200 may include a controller 202, and a number of memory components 204, each of which may implement and/or be implemented by, the memory system 100 of FIG. 1. In the example of FIG. 2, each of the memory components is a DRAM. Each DRAM 204 includes a memory array 206 (e.g., 118 of FIG. 1), an ECC circuit (e.g., 120 of FIG. 1), and a multibit error (MBE) detection logic 210 (e.g., 130 of FIG. 1).

The controller 202 may operate the memory components 204. For example, the controller 202 may perform access operations, such as read and write operations, by providing commands (e.g., a read command, a write command) and addresses (e.g., row, column, and/or bank addresses) along a bus to one or more of the memory components 204. The controller 202 may perform various other types of operations, such as entering one or more memory components 204 into a refresh mode or performing a mode register read operation to retrieve information from a mode register of the memory component 204.

Each memory component 204 includes a memory array 206 which stores information. During an example write operation to a memory component, the controller 202 may provide data and an address to the memory component. The ECC circuit 208 may generate parity bits based on the data, and the data and parity may be written to memory cells of the memory array 206 specified by the address. During an example read operation, the controller 202 may provide an address and a read command. The memory component 204 may retrieve the data and the parity bits from the memory cells of the memory array 206 associated with the address. The ECC circuit 208 may use the read parity bits and the read data bits to generate syndrome bits. The syndrome bits may in turn be used to locate and correct a single bit error in the read data.

The syndrome may also be used by the MBE detection logic 210 to determine if the read data includes a multi-bit error (e.g., 2 or more bits are in error). Responsive to detecting an MBE, the MBE detection logic may provide an MBE signal at an active level. In some embodiments, the MBE signal being active may set a flag in a mode register (e.g., 132 of FIG. 2) of the memory component 202. The controller 202 may check the MBE flag of the various module's 204 mode registers (e.g., periodically). In some embodiments, if the MBE flag is high in a given memory component 204, the controller 202 may take various corrective actions. For example, the controller 202 may take action to mitigate data corruption now that a particular memory component 204 has been identified to contain the error. For example, the controller 202 may isolate (all or part of) a memory component 204 to prevent further access operations to the isolated component (or portion of the component).

Beyond an MBE flag the memory components 204 may use various other schemes in addition to, or instead of the MBE flag, to notify the controller 202 that an MBE has occurred. For example, when an MBE signal is activated, it may change a count value (e.g., increment the count). The count value may be stored in the mode register, and the controller may take various actions based on the count value in a given memory component 204 (e.g., isolate the memory component 204 when its count value exceeds a threshold value). In another example, when the MBE signal is activated, the memory component 204 may save one or more addresses associated with the accessed memory cells which included the MBE (e.g., the address(es) may be saved in the mode register). The controller 202 may then make decisions based on the identified address (e.g., isolate that particular memory address in that component). In another example, responsive to the MBE signal being active, the memory component 204 may provide an immediate alert to the controller 202. For example, the memory component 204 may activate an ALERT pin, which may notify the controller 202 of the MBE either directly, or by prompting the controller 202 to check the mode registers.

The controller 202 may, in some embodiments, change the MBE flag (or count). For example, the controller 202 may reset the MBE flag. For example, the controller 2020 may reset the flag to an inactive state after responding to the flag (e.g., isolating the memory), upon performing a mode register read operation to determine the state of the flag, or combinations thereof. In embodiments where a count of MBEs is stored (e.g., in the mode register), the controller 202 may change the count (e.g., decrement it). For example, if the count is stored in the mode register, then when the count is read from the mode register, the controller 202 may change the count (e.g., by decrementing it, resetting it etc.).

Any of the example responses to the MBE signal being active described herein may be used alone or in any combination with one or more other responses.

FIG. 3 is a block diagram of multi-bit error logic according to some embodiments of the present disclosure. The MBE logic 300 may represent a portion of a memory system, such as the memory device 100 and/or memory component 204 of FIG. 2. The MBE logic 300 includes a memory array 310 (e.g., 118 of FIG. 1 and/or 206 of FIG. 2), an ECC circuit 320 (e.g., 120 of FIG. 1 and/or 208 of FIG. 2), and MBE detection logic 330 (e.g., 130 of FIG. 1 and/or 210 of FIG. 2). For clarity the MBE logic 300 may only show certain components and signals of a memory. It should be understood that additional signals and components not shown in FIG. 3 may interact with the components shown in FIG. 3.

The MBE logic 300 may, in some embodiments, represent a portion of a memory which uses single error correction single error detection (SEC-SED) error correction.

Figure 6:
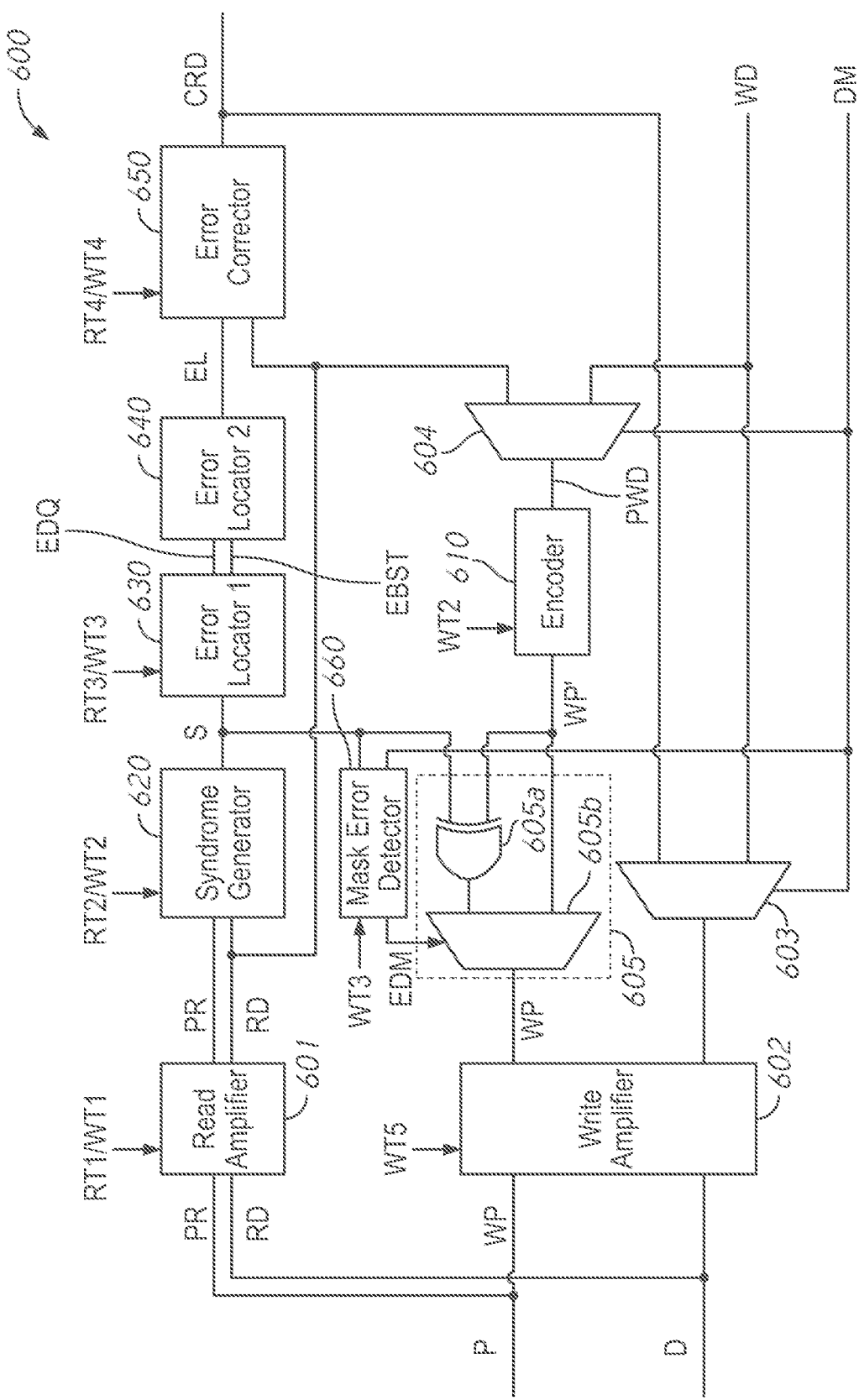
FIG. 6 is a schematic diagram of an error correction code (ECC) control circuit according to some embodiments of the present disclosure.

The memory array 310 includes data bits 312 and associated parity bits 314. For example the data bits 312 and parity bits 314 may be stored along a word line. During a read operation, the data may be read out as read data RD and the parity may be read out as read parity RP to an ECC circuit 320. The ECC circuit 320 includes a logic tree 322 which generates a new set of parity bits P' based on the read data RD. The logic tree 322 may match (and/or may be) the logic tree used to generate the parity bits 314 stored in the memory array 310 when the data 312 was written to the memory array 310. A syndrome generator 322 compares the new parity P' to the read parity RP to generate syndrome bits S. Although not shown in FIG. 3, the ECC circuit may use the syndrome bits to locate and correct a single bit error, if any. FIG. 6 discusses an ECC circuit in more detail.

The MBE detection logic 330 includes unmapped syndrome logic 332, which uses the syndrome bits S to determine if there is a multi-bit error. There may be M data bits 112 and K parity bits 114, which in turn leads to K syndrome bits. The number of data and parity bits may be chosen to fulfill equation 1, below:

$$2^{K}-1 \geq M+K \qquad \text{Eqn. 1}$$

In an example embodiment, there may be 128 data bits and 8 parity bits. Accordingly, there may also be 8 syndrome bits with 256 states, which greatly exceeds the value M+K (e.g., 136). Some of the possible values of the syndrome S may be mapped to the different data and parity bits read from the memory array (e.g., RD and RP). Each of these mapped states of the syndrome bits S may in turn be used to detect (and correct) a single bit error in one of those data and parity bits. For example, a first syndrome state is mapped to a first data bit, a second syndrome state is mapped to a second data bit, etc. However, as there are more possible states of the syndrome than there are data+parity bits, in some embodiments, some of the syndrome states may be un-mapped. For example, if the syndrome states are assigned sequentially, then any state above 136 will not be mapped to a data or parity bit.

The ECC logic may generate a mapped state of the syndrome bits S as long as there is no error or a single bit error. If the syndrome bits S have an unmapped state, it indicates a multi-bit error has occurred. Accordingly, the unmapped syndrome logic 332 may check the syndrome bits S to determine if they have an unmapped state. For example, the unmapped syndrome logic 332 may check the syndrome value against a table of unmapped values, or may determine that a value of the syndrome bits is greater than a threshold (e.g., the value is greater than 136), etc. If the syndrome bits S have an unmapped value, the unmapped syndrome logic may provide a multi-bit error signal MBE1 at an active level.

The MBE detection logic 300 of FIG. 3 may leverage existing ECC architecture (e.g., a SEC-SED architecture) to locate MBE. The use of unmapped syndrome logic alone may cause certain MBEs to go undetected (e.g., certain MBEs may cause the syndrome to have a state which is still mapped, although the ECC circuits interpretation of that mapped state as a single bit error will be incorrect). While certain MBEs may be missed, the scheme of FIG. 3 may be useful as it leverages existing architecture and does not require, for example, the addition of a parity bit.

The MBE detection logic 330 includes MBE signal logic 334 which take one or more actions based on the signal MBE1 being active. In some embodiments, the MBE signal logic 334 may check a status of an MBE flag in a mode register. If, the MBE flag was not previously set, the MBE signal logic 334 may set the MBE flag to an active level (e.g., by modifying a state in the mode register). If the MBE flag was set, the MBE signal logic 334 may leave the MBE flag as is. In some embodiments, the MBE signal logic 334 may update a count value responsive to an activation of the signal MBE1 (e.g., the count value may be updated). In some embodiments, the count value may be stored in a mode register. In some embodiments, when the count value reaches a certain value (e.g., when in crosses a threshold), the MBE signal logic 334 may set an MBE flag as described previously. In some embodiments, when the signal MBE1 becomes active, the MBE signal logic 334 may capture one or more addresses associated with the data bits RD. For example a row, column, and/or bank address may be captured. In some embodiments, the MBE signal logic 334 may write the captured address(es) to a mode register along with the MBE flag. In some embodiments, the MBE signal logic 334 may provide an immediate signal to a controller. For example, the MBE signal logic 334 may activate an ALERT pin or other signal to the controller, instead of, or in addition, to setting a flag in the mode register. In some embodiments, the signal MBE1 may be passed on as the signal MBE directly, and the MBE signal logic 334 may be omitted.

FIG. 4 is a block diagram of multi-bit error logic according to some embodiments of the present disclosure. The MBE logic 400 may represent a portion of a memory system, such as the memory device 100 and/or memory component 204 of FIG. 2. The MBE logic 400 may be generally similar to the MBE logic 300, except that the MBE logic 400 uses parity check logic 436 rather than unmapped syndrome logic (e.g., 332 of FIG. 3) to detect an MBE. For the sake of brevity, features and components previously described with respect to FIG. 3 will not be described again with respect to FIG. 4. The embodiment of FIG. 4 may differ primarily in the use of the parity check logic 446. It may be generally assumed that except where otherwise noted the descriptions of components in FIG. 3 may also apply to the analogous components of FIG. 4.

The MBE logic 400 may, in some embodiments, represent a portion of a memory which uses single error correction double error detection (SEC-DED) error correction.

The MBE logic 400 includes a memory array (e.g., 118 of FIG. 1, 206 of FIG. 2, and/or 310 of FIG. 3), an ECC circuit 420 (e.g., 120 of FIG. 1, 208 of FIG. 2, and/or 320 of FIG. 3), and MBE detection logic 430 (e.g., 130 of FIG. 1, 210 of FIG. 2, and/or 330 of FIG. 3).

The memory array 410 stores an additional parity bit 416 in addition to the data bits 412 and parity bits 414. The additional parity bit is also associated with the data 410. For example, if in the embodiment of FIG. 3, there are 128 data bits and 8 parity bits, then in the embodiment of FIG. 4, there may be 128 data bits and 9 total parity bits, including 8 parity bits and 1 additional parity bit. During the read operation, the additional parity bit may be read out as an extra parity EP.

The MBE detection logic 430 includes parity check logic 436 which receives the read data RD, the read parity RP, and the additional parity bit EP. The use of the additional parity bit EP may allow for reliable detection of two bit errors, and detection of MBEs that don't satisfy the odd or even parity. The parity check logic 436 may generate a set of new parity bits from the read data in a manner similar to the logic 422. These new parity bits may be compared to the read parity bits RP and to the extra parity EP. In some situations, multi-bit errors may cause a change in whether there are an even or odd number of bits at a high logical level in the plurality of data and parity bits. The extra parity bit EP may indicate this, which may allow the parity check logic 436 to determine if an MBE has occurred. For example, the read data RD and the read parity RP may be used to generate a second syndrome in a manner analogous to the ECC circuit 420. If the second syndrome is non-zero (indicating an error), but the number of active bits do not properly tally to even or odd (as indicated by the additional parity bit EP), then it may indicate that an MBE has occurred.

If the parity check logic 436 determines that an error has occurred, then a signal MBE2 may be provided at an active level. The MBE signal logic 434 may respond to the signal MBE2 in a manner analogous to the way in which the MBE signal logic 334 of FIG. 3 was described as responding to the signal MBE1.

Similar to the embodiment of FIG. 3, the use of parity check logic 436 alone to check for MBEs may be useful as it may leverage the capabilities of a memory which uses a SEC-DED scheme. However, also similar to the embodiment of FIG. 3, the use of parity check logic 436 alone may miss certain MBEs. Accordingly, in some applications where it is desired to detect a higher percentage of MBEs (at the trade-off of increased logic circuits, the use of an additional parity bit etc.) it may be useful to combine the parity check logic 436 of FIG. 4 with the unmapped syndrome logic 332 of FIG. 3.

FIG. 5 is a block diagram of multi-bit error logic according to some embodiments of the present disclosure. The MBE logic 500 may represent a portion of a memory system, such as the memory device 100 and/or memory component 200 of FIG. 2. The MBE logic 500 may be generally similar to the MBE logic 300 and 400 of FIGS. 3 and 4, except that the MBE logic 500 uses both unmapped syndrome logic 532 and parity check logic 536. Since the MBE logic 500 may represent a combination of the features described with respect to FIGS. 3 and 4, for the sake of brevity, features and components previously described with respect to FIGS. 3 and 4 will not be described again with respect to FIG. 5. It may be generally assumed that except where otherwise noted the descriptions of components in FIGS. 3 and 4 may also apply to the analogous components of FIG. 5.

The MBE logic 500 may, in some embodiments, represent a portion of a memory which uses both SEC-SED and SEC-DED error correction.

In the MBE detection logic 530, the MBE signal logic 534 may receive both the signal MBE1 from the unmapped syndrome logic 532 and the signal MBE2 from the parity check logic 536. The MBE signal logic 534 may react to either signal MBE' or MBE2 being active in a manner analogous to that described with respect to FIG. 3. Since the two signals MBE1 and MBE2 are generated through different detection schemes, they may respond to different MBEs. In other words, an MBE which is not detected by the unmapped syndrome logic 532 may still be detected by the parity check logic 536, and similarly an MBE detected by the unmapped syndrome logic 532 may not be detected by the parity check logic 536. Some MBE's may be detected by both (or by neither). In this manner the use of both unmapped syndrome logic 532 and parity check logic 536 may complement each other and allow for a broader range of MBEs to be detected than if either scheme was used alone.

FIG. 6 is a schematic diagram of an error correction code (ECC) control circuit according to some embodiments of the present disclosure. The ECC control circuit 600 of FIG. 6 may, in some embodiments, be included in the ECC circuit 120 of FIG. 1, 208 of FIG. 2, 320 of FIG. 3, 420 of FIG. 4, and/or 520 of FIG. 5. The ECC control circuit 600 may receive write data bits WD and may generate written parity bits WP. These may be provided to the memory array as data bits D and parity bits P. The ECC control circuit 600 may receive data D from the memory array as read data RD and parity bits P as read parity bits PR and may generate corrected data bits CRD based on the bits RD and PR.

During an example read operation, the read amplifier 601 is activated in response to the timing signal RT1 to amplify the read parity bits PR and read data RD. The amplified bits PR and RD are provided to a syndrome generator circuit 620, which is activated in response to a timing signal RT2, which activates at a time after RT1 is active. The syndrome generator 620 provides syndrome bits S based on the read bits RD and PR. The syndrome generator 620 of FIG. 6 may include both the logic tree (e.g., 322, 422, and/or 522 of FIGS. 3-5) and the syndrome generator of FIGS. 3-5. In some embodiments, the number of syndrome bits S may match the number of parity bits PR. The syndrome bits S are provided to an error locator circuit 630. The syndrome bits S may have a state which if it is a state mapped by the error locator 630 indicates which of the read data RD bits is in error.

The error locator circuit 630 provides a first set of error determination signals EBST and a second set of error determination bits EDQ based, in part, on the syndrome bits S. The error locator circuit 630 may activate responsive to a timing signal RT3, which may activate after the signal RT2. Data provided to/received at the DQ terminals may be organized into bursts on a number of different DQ terminals (e.g., a burst of 8 bits on each of 16 different DQ terminals for 128 total bits). The first set of error determination signals EBST may indicate a location of an error bit within a burst. In some embodiments, there may be a bit for each of the bits in the burst, and the signals EBST may be provided in common to the DQ terminals. The second set of error determination signals EDQ may indicate which of the DQ terminals the error bit is being provided to. In some embodiments, there may be a bit for each DQ terminal, and the signals EDQ may be provided in common with the burst bits.

The error determination signals EBST and EDQ may be provided to an error locator circuit 640. The error locator circuit 640 may decode the signals EBST and EDQ to identify a location of an error bit in the read data RD. The location of the error bit may be specified by an error location signal EL. In some embodiments, there may be a number of bits of the error location signal EL based on the number of bits of the read data RD, with each bit of the error location signal EL associated with a bit of the read data RD.

The error position signal EL is provided to error corrector circuit 650. The error corrector circuit 650 also receives the read data RD and corrects one or more error bits in the RD based on the error location signal EL. For example, if an nth bit of the error location signal EL is at a high logical level, then the error corrector circuit 650 may change a state of the nth read bit RD. The error corrector circuit 650 may provide the corrected read data CRD. The error corrector circuit 650 may be activated in response to the timing signal RT4, which may be activated after the signal RT3. The corrected read data CRD may be provided to the DQ pads and read off of the device.

In an example write operation to the memory device, the ECC control circuit 600 may receive write data WD and a data mask signal DM. A first multiplexer 603 may synthesize the write data WD and the corrected read data CRD based on the data mask signal DM. The first multiplexer 603 may provide the data D, which is written to the memory array. In some embodiments, the data mask signals DM may be associated with the different burst bits received at the data terminals. When one (or more) of the data mask bits DM is active, then the write data WD associated with that data mask bit may be replaced by the corrected read data CRD in the data D.

A second multiplexer 604 may synthesize the write data WD and the read data RD based on the data mask signal. The second multiplexer 604 may provide parity write data PWD. The parity write data PWD may be provided to an encoder circuit 610, which may encode the parity data PWD into the write parities WP'. The write parities WP' are provided to a converter circuit 605 which generates the write parities WP, which are written to the memory array as the parity bits P.

The converter circuit 605 includes an XOR logic gate 605a and a third multiplexer 605b. The XOR logic gate 605a has input terminals coupled to the syndrome bits S and the write parity bits WP'. The XOR logic gate 605a provides an output which is at a high logical level when the syndrome bite S is different from the associated write parity bit WP'. The third multiplexer 605b provides either the output of the XOR logic gate 605a or the write parity WP' as the write parity WP. The multiplexer 605b choses the source of the write parity WP bits based on a conversion signal EDM.

When the conversion signal EDM is active, the write parity WP is the output of the XOR gate 605a. When the conversion signal EDM is inactive, the signal WP' is provided as the signal WP. The write parity WP and the write data WD may be provided to a write amplifier 602, which may provide them as the parity P and data D to be written to the memory array.

A mask error detector circuit 660 provides the signal EDM based on the syndrome bits S and on the data mask DM. The mask error detector circuit 660 may determine whether or not burst data to which an error bit belongs and burst data masked by the data mask signal DM are coincident. If they are coincident, then the signal EDM may be activated. If they are not coincident, the signal EDM may remain inactive.

Figure 7:
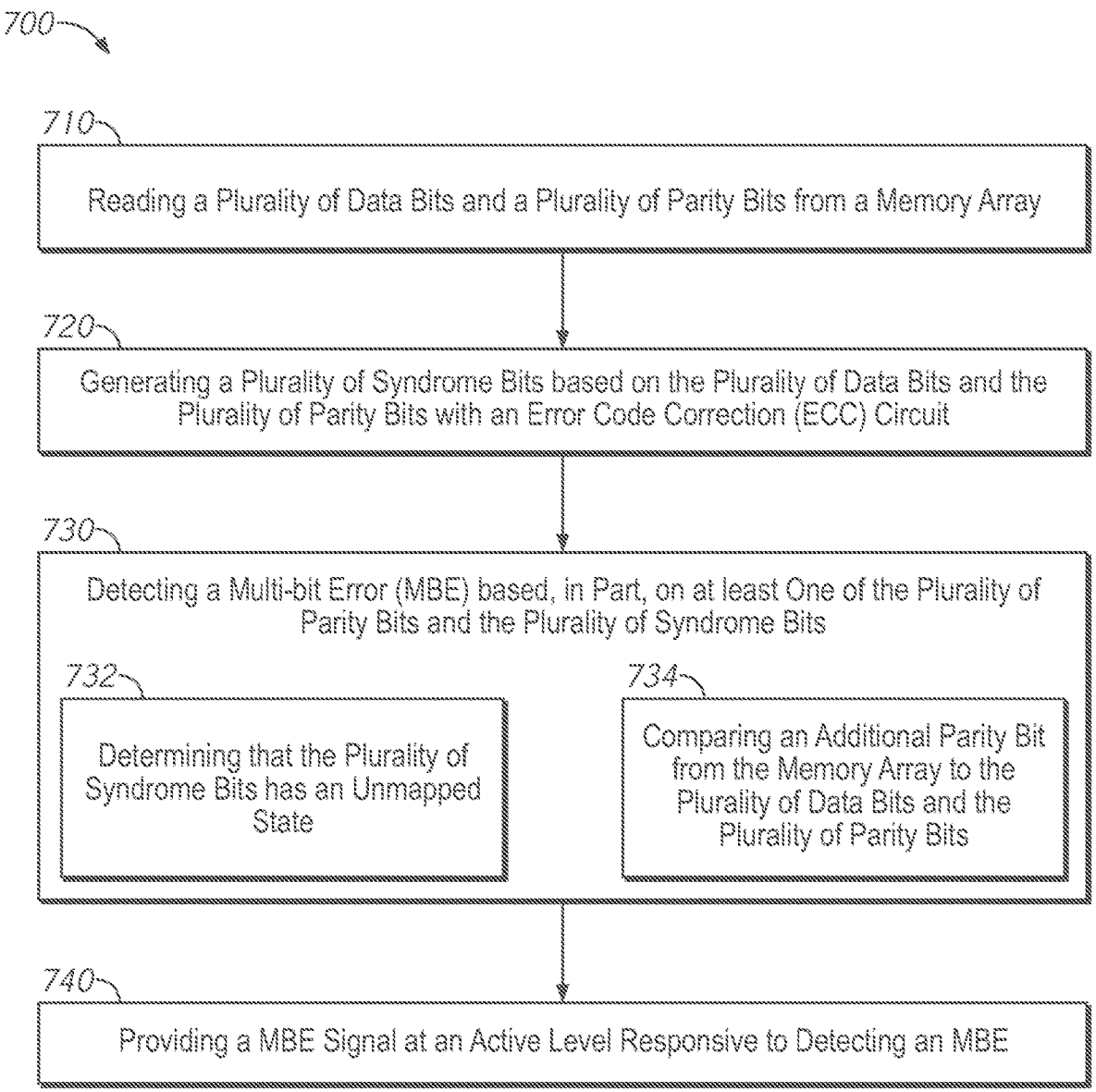
FIG. 7 is a flow chart of a method according to an embodiment of the present disclosure.

FIG. 7 is a flow chart of a method according to an embodiment of the present disclosure. The method 700 may be implement by one or more of the apparatuses or systems described with respect to FIGS. 1-6.

The method 700 includes box 710, which describes reading a plurality of data bits and a plurality of parity bits from a memory array. The data bits and parity bits may be read as part of a read operation. The data bits and parity bits may have previously stored in the memory as part of a write operation. In some embodiments, there may also be an additional parity bit which is read out of the memory array.

The method 700 includes box 720, which describes generating a plurality of syndrome bits based on the plurality of data bits and the plurality of parity bits with an error code correction (ECC) circuit. Generating the syndrome bits may include generating a second set of parity bits based on the read data and then comparing the second set of parity bits to the read parity bits.

The method 700 may include locating and correcting up to a single error in the plurality of data bits based on the plurality of syndrome bits.

The method 700 includes box 730, which describes detecting a multi-bit error (MBE) based, in part, on at least one of the plurality of parity bits and the plurality of syndrome bits. Box 730 is shown as including two sub-boxes, 732 and 734, which describe methods of detecting an MBE. Boxes 732 and 734 may be used alone, or in combination with each other.

Box 732 describes determining if the plurality of syndrome bits has a mapped state or an unmapped state. The plurality of syndrome bits may have a number of states, some of which are mapped (e.g., to the plurality of data and parity bits) and some of which are unmapped. Unmapped syndrome logic may determine if the syndrome bits have an unmapped state, which may indicate an MBE.

Box 734 describes detecting the multi-bit error by comparing the plurality of data bits, the plurality of parity bits and the additional parity bit.

The method 700 includes box 740, which describes providing an MBE signal at an active level responsive to detecting an MBE. The MBE signal may be provided at an active level based on either the process described in box 732, the process in box 734 or both.

In some embodiments, the method 700 may include setting an MBE flag in a mode register responsive to the MBE signal being active.

In some embodiments, the method 700 may include capturing an address associated with the plurality of data bits (e.g., a row, column, and/or bank address). The method 700 may include storing the captured address in the mode register.

In some embodiments the method 700 may include counting a number of times that the MBE signal has been activated.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
 a memory array configured to store a plurality of data bits and a plurality of parity bits associated with the plurality of data bits;
 an error code correction (ECC) circuit configured to generate a plurality of syndrome bits based on the plurality of data bits and the plurality of parity bits; and
 multi-bit error (MBE) detection logic configured to determine if a multi-bit error is present in the plurality of data and parity bits based, in part, on at least one of the plurality of parity bits and the plurality of syndrome bits, wherein the MBE detection logic is configured to provide an MBE signal at an active level if an MBE is present, and wherein responsive to MBE signal being active, an MBE flag is set in a mode register,
 wherein the plurality of syndrome bits has a plurality of states, and wherein a first portion of the plurality of states are mapped to a respective one of the plurality of data bits or one of the first plurality of parity bits, and a second portion of the plurality of states are unmapped, and wherein the MBE detection logic includes unmapped syndrome logic configured to detect the MBE based on the plurality of syndrome bits having a state in the second portion.

2. The apparatus of claim 1, wherein the MBE detection logic is configured to provide the MBE signal at the active level based at least in part on at least one of the plurality of syndrome bits having the state in the second portion.

3. The apparatus of claim 1, wherein responsive to the MBE flag being set, an address associated with the plurality of data bits is stored in the mode register.

4. The apparatus of claim 1, wherein responsive to the MBE signal being active, a controller is configured to change a count value.

5. The apparatus of claim 1, wherein the second portion of the plurality of states are unmapped to single bit locations in the plurality of data bits and plurality of parity bits, and wherein the unmapped states represent multi-hit errors that are uncorrectable by the ECC circuit when using a single error correction, single error detection (SEC-SED) scheme.

6. The apparatus of claim 1, wherein the memory array is further configured to store an additional parity bit, and wherein the MBE detection logic includes parity check logic configured to detect the multi-bit error based on the plurality of data bits, the plurality of parity bits and the additional parity bit.

7. The apparatus of claim 6, wherein the parity check logic is configured to generate a second syndrome based on the plurality of data bits and the plurality of parity bits and compare the second syndrome to the additional parity bit to determine if there is an MBE.

8. A system comprising:
a controller;
a plurality of memory components, each memory component comprising:
a memory array configured to store a plurality of data bits and a plurality of parity bits associated with the plurality of data bits;
an error code correction (FCC) circuit configured to generate a plurality of syndrome bits based on the plurality of data bits and the plurality of parity bits; and
multi-bit error (MBE) detection logic configured to determine if a multi-bit error is present in the plurality of data bits based, in part, on at least one of the plurality of parity bits and the plurality of syndrome bits, wherein the MBE detection logic is configured to provide an MBE signal at an active level if an MBE is present, and wherein responsive to MBE signal being active, an MBE flag is set in a mode register,
wherein the plurality of syndrome bits has a plurality of states, and wherein a first portion of the plurality of states are mapped to a respective one of the plurality of data bits or one of the first plurality of parity bits, and a second portion of the plurality of states are un-mapped, and wherein the MBE detection logic includes unmapped syndrome logic confit used to detect the MBE based on the plurality of syndrome bits having a state in the second portion.

9. The system of claim 1, wherein responsive to the MBE signal being active in one of the plurality of memory components, the controller is configured to isolate the one of the plurality of memory modules.

10. The system of claim 8, wherein the controller is coupled to the plurality of memory components by an alert pin, and wherein each of the plurality of memory components is configured to provide an alert signal at an active level along the alert pin responsive to the MBE signal at the active level.

11. The system of claim 8, wherein the plurality of syndrome bits has a plurality of states, and wherein a first portion of the plurality of states are mapped to a respective one of the plurality of data bits or one of the first plurality of parity bits, and a second portion of the plurality of states are un-mapped, and wherein the MBE detection logic includes unmapped syndrome logic configured to detect the MBE based on the plurality of syndrome bits having a state in the second portion.

12. The system of claim 8, wherein the memory array is further configured to store an additional parity bit, and
wherein the MBE detection logic includes parity check logic configured to detect the multi-bit error based on the plurality of data bits, the plurality of parity bits and the additional parity bit.

13. The system of claim 8, wherein the controller is configured to reset the MBE flag.

14. The system of claim 8, wherein each memory component is further configured to change a respective count value in a first direction responsive to the MBE signal at the active level, and wherein the controller is configured to change the respective count value in a second direction opposite the first direction.

15. An apparatus comprising:
a memory array configured to store a plurality of data bits and a plurality of parity bits;
an error code correction (ECC) circuit configured to generate a plurality of syndrome bits based off the plurality of data bits and the plurality of parity bits as part of a read operation, wherein the plurality of syndrome bits has a number of mapped states and a number of unmapped states; and
multi-bit error (MBE) detection logic comprising unmapped syndrome logic configured to activate a first multi-bit error signal if the plurality of syndrome bits has one of the unmapped states.

16. The apparatus of claim 15, wherein the memory array is further configured to store an additional parity bit, and
wherein the MBE detection logic further includes parity check logic configured to detect the multi-bit error based on the plurality of data bits, the plurality of parity bits and the additional parity bit, wherein the parity check logic is configured to provide a second MBE signal at an active level if it detects an MBE.

17. The apparatus of claim 16, further comprising MBE signal logic configured to provide an MBE signal at an active level if either the first or the second MBE signal is at the active level.

18. The apparatus of claim 15, wherein each of the mapped states is associated one of the plurality of data bits or one of the plurality of parity bits.

19. The apparatus of claim 15, wherein responsive to the first MBE signal being active, an MBE flag is set in a mode register.

20. An apparatus comprising:
a memory array configured to store a plurality of data bits, a plurality of parity bits, and an additional parity bit;
an error code correction ((CC) circuit configured to locate and correct single bit errors in the plurality of data bits based on at least one of the plurality of parity bits; and
multi-bit error (MBE) detection logic including parity check logic configured to activate a first MBE signal based on detecting an MBE, wherein the MBE is detected based on a comparison of the plurality of data bits, the plurality of parity bits and the additional parity bit, and wherein responsive to MBE signal being active, an MBE flag is set in a mode register,
wherein the ECC, circuit is configured to generate a plurality of syndrome bits based off the plurality of data bits and the plurality of parity bits, wherein the plurality of syndrome bits has a number of mapped states and a number of unmapped states,
wherein the MBE detection logic further comprises unmapped syndrome logic configured to activate a second MBE signal if the plurality of syndrome bits has one of the unmapped states, and
wherein the plurality of syndrome bits has a plurality of states, and wherein a first portion of the plurality of states are mapped to a respective one of the plurality of data bits or one of the first plurality of parity bits, and a second portion of the plurality of states are un-mapped, and wherein the MBE detection logic includes unmapped syndrome logic configured to detect the MBE based on the plurality of syndrome bits having a state in the second portion.

21. The apparatus of claim 20, further comprising MBE signal logic configured to set the MBE flag in the mode register responsive to the first or the second MBE signal being active.

22. The apparatus of claim 20, further comprising MBE signal logic configured to change a count value each time the first MBE signal is activated.

23. A method comprising:
reading a plurality of data bits and a plurality of parity bits from a memory array;
generating a plurality of syndrome bits based on the plurality of data bits and the plurality of parity bits with an error code correction (ECC) circuit;
detecting a multi-bit error (MBE) based, in part, on at least one of the plurality of parity bits and the plurality of syndrome bits; and
providing an MBE signal at an active level responsive to detecting an MBE, and wherein responsive to MBE signal being active, an MBE flag is set in a mode register,
wherein the plurality of syndrome bits has a plurality of states, and wherein a first portion of the plurality of states are mapped to a respective one of the plurality of data bits or one of the first plurality of parity bits, and a second portion of the plurality of states are unmapped, and wherein the detecting the MBE is based on the plurality of syndrome bits having a state in the second portion.

24. The method of claim 23, further comprising determining if the plurality of syndrome bits has a mapped state or an unmapped state, and providing the MBE signal at the active level responsive to determining that the plurality of syndrome bits have the unmapped state.

25. The method of claim 23, further comprising:
storing an additional parity bit; and
detecting the multi-bit error based on the plurality of data bits, the plurality of parity bits and the additional parity bit.

26. The method of claim 23, further comprising storing an address associated with the plurality of data bits responsive to the MBE signal being active.

* * * * *

UNITED STATES PATENT AND TRADEMARK OFFICE
CERTIFICATE OF CORRECTION

| | |
|---|---|
| PATENT NO. | : 11,646,751 B2 |
| APPLICATION NO. | : 17/348654 |
| DATED | : May 9, 2023 |
| INVENTOR(S) | : Markus H. Geiger et al. |

Page 1 of 1

It is certified that error appears in the above-identified patent and that said Letters Patent is hereby corrected as shown below:

In the Claims

| | Reads | Should Read |
|---|---|---|
| Column 15, Line 18 | "An error code correction (FCC) circuit" | --An error code correction (ECC) circuit-- |
| Column 15, Line 35 | "syndrome logic confit used to detect" | --syndrome logic configured to detect-- |
| Column 16, Line 40 | "an error code correction ((CC) circuit" | --an error code correction (ECC) circuit-- |

Signed and Sealed this
Nineteenth Day of August, 2025

Coke Morgan Stewart
*Acting Director of the United States Patent and Trademark Office*